United States Patent [19]
Nishiyama et al.

[11] Patent Number: 5,107,335
[45] Date of Patent: Apr. 21, 1992

[54] AUTOMATIC FREQUENCY CONTROL METHOD AND RECEIVING APPARATUS USING THEREOF

[75] Inventors: Takao Nishiyama, Daitou; Hisao Okada, Katano; Tatsuaki Doumura, Osaka, all of Japan

[73] Assignee: Sanyo Electric Co., Ltd., Moriguchi, Japan

[21] Appl. No.: 588,879

[22] Filed: Sep. 27, 1990

[30] Foreign Application Priority Data

Sep. 29, 1989 [JP] Japan .................. 1-255701

[51] Int. Cl.⁵ ............................................... H01N 5/50
[52] U.S. Cl. ............................. 358/195.1; 455/192.2; 455/316
[58] Field of Search ............................ 358/195.1, 188; 455/192, 196, 314, 315, 316

[56] References Cited

U.S. PATENT DOCUMENTS

| | | | |
|---|---|---|---|
| 4,161,698 | 7/1979 | Klank | 455/196 |
| 4,365,349 | 12/1982 | Ogita et al. | 455/192 |
| 4,417,279 | 11/1983 | Shinkawa et al. | 358/188 |
| 4,489,343 | 12/1984 | Hosoya | 358/188 |
| 4,817,195 | 3/1989 | Kubo et al. | 455/192 |
| 4,817,197 | 3/1989 | Shimizu et al. | 455/316 |
| 4,975,775 | 12/1990 | Satoh | 358/195.1 |
| 4,977,613 | 12/1990 | Holcomb, Sr. et al. | 455/192 |
| 4,991,226 | 2/1991 | Bonjiorno | 455/316 |
| 5,003,397 | 3/1991 | Wink | 455/192 |

OTHER PUBLICATIONS

"High-Performance BS Tuner", National Technical Report, vol. 34, No. 5, Oct. 1988.

*Primary Examiner*—James J. Groody
*Assistant Examiner*—Jeffrey S. Murrell
*Attorney, Agent, or Firm*—Armstrong, Nikaido, Marmelstein, Kubovcik & Murray

[57] ABSTRACT

A second IF signal is counted either directly or indirectly. An AFC operation is performed based on the counting result. A plurality of count periods (A1, C1) are provided within a video signal period (Y+H) including a horizontal blanking period, and the plurality of count periods (A1, C1) are randomly shifted for each field. An AFC operation is performed based on a plurality of counting results in a plurality of field periods which correspond to one cycle of an energy diffusion signal.

19 Claims, 14 Drawing Sheets

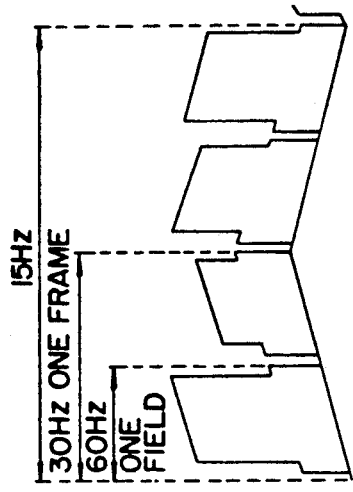
FIG.2(a) DEMODULATION OUTPUT
PRIOR ART
FIG.2(b) VD
PRIOR ART
FIG. 2(c) CI
PRIOR ART
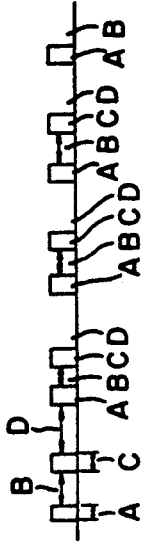
FIG.2(d) GATE
PRIOR ART

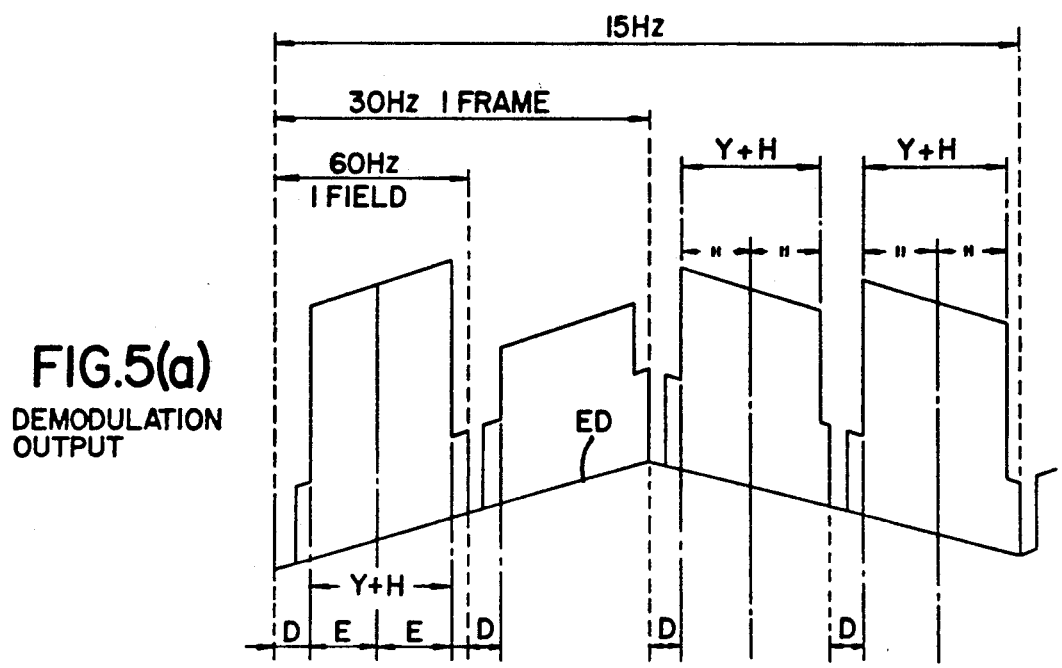
FIG.5(a) DEMODULATION OUTPUT
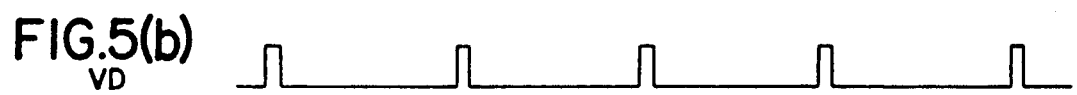
FIG.5(b) VD
FIG.5(c) cl
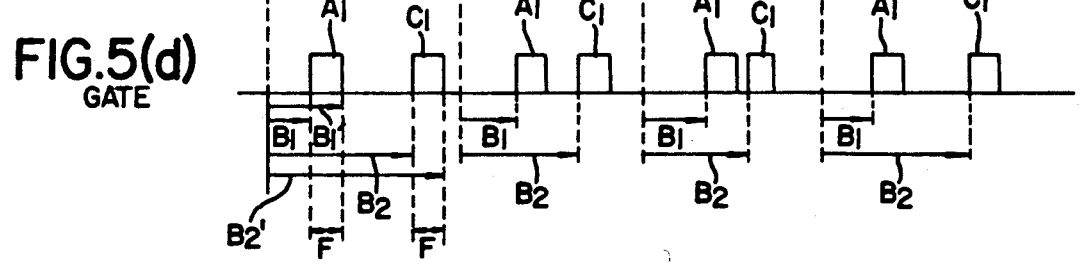
FIG.5(d) GATE

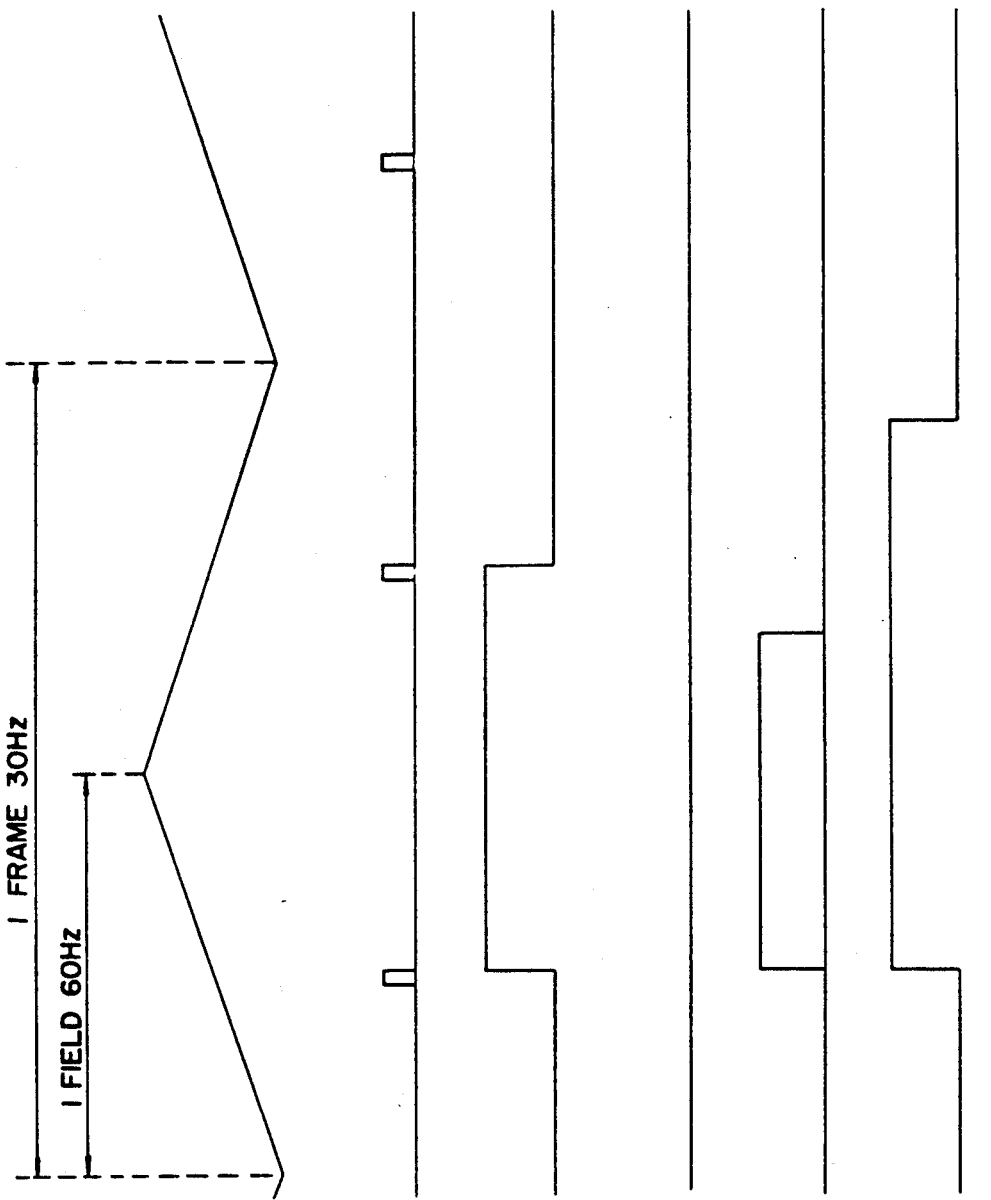

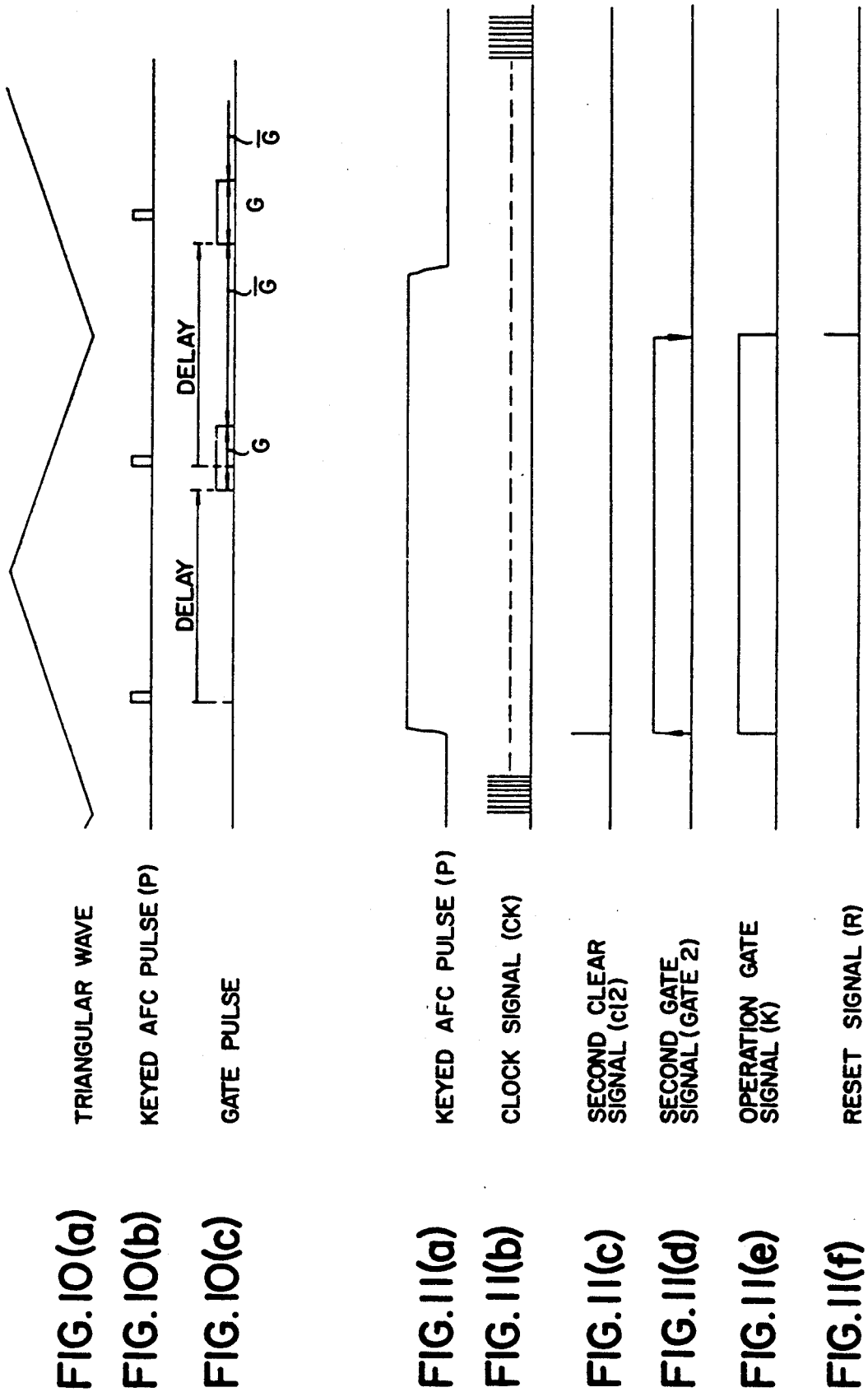

AUTOMATIC FREQUENCY CONTROL METHOD AND RECEIVING APPARATUS USING THEREOF

BACKGROUND OF THE INVENTION

1. Field of the Invention

The present invention relates generally to an AFC (automatic frequency control) method and a receiving apparatus using it, and more particularly, to a method for improving the accuracy of AFC and a receiving apparatus using the improved AFC method.

2. Description of the Background Art

In satellite broadcasting which is currently carried out in Japan, a video signal of the NTSC (National Television System Committee) standard is FM-modulated to be transmitted as an FM video signal of 12 GHz band.

On the receiving side, this FM video signal of 12 GHz band is converted into a first intermediate frequency signal of 1 GHz band, and further down-converted into a second intermediate frequency signal of the frequency band including 134.26 MHz, and 402.78 MHz. Thereafter, the second intermediate frequency signal is FM-demodulated so that a video signal is supplied as an output.

The oscillation frequency of a local oscillator for a down-conversion is satisfactorily controlled by an AFC circuit (automatic frequency control circuit). A plurality of circuits constitute an AFC loop, to perform an AFC operation. Ordinary AFC utilizes the fact that the level of a direct current signal in a synchronizing signal portion of the video signal outputted from an FM modulator corresponds to the frequency of the second intermediate frequency signal. Thus, in the ordinary AFC, this level of the direct current signal is detected and the results of this detection is fedback, thereby to control the oscillation frequency of the local oscillator (see U.S. Pat. No. 4,417,279).

However, the direct current signal has the disadvantage of being susceptible to a drift or the like. Therefore, a technique is developed in which the frequency of the second intermediate frequency signal (hereinafter referred to as second IF signal) is counted, and the count data obtained by the counting discounting is fedback to control the frequency of the local oscillator.

Referring to FIGS. 1 and 2, this example will be briefly described.

In FIG. 1, a BS (broadcasting satellite) antenna 10 comprises an antenna portion 11 and a first converter 12. The antenna portion 11 is, for example, a parabolic antenna or a plane antenna. The first converter 12 comprises an oscillator 13 and a mixer 14. In the first converter 12, a satellite broadcasting signal (FM video signal) of 12 GHz band received by the antenna portion 11 is mixed with an output of the oscillator 13 by the mixer 14. Consequently, an FM video signal (first intermediate frequency signal) (hereinafter referred to as first IF signal) of approximately 1 GHz band is supplied as an output. Fluctuations in the frequency of the first IF signal is allowed to ±1.5 MHz. The fluctuations are corrected by an AFC operation.

A BS tuner 16 comprises a second down-converter 18, a PLL (Phase Locked Loop) circuit 30, a microcomputer 32 for channel selection, an FM demodulating block 34, a counter circuit 46, an output processing block 64, and a synchronizing separator circuit 68.

The second down-converter 18 converts a first IF signal into a second IF signal advantageous for a multi channel, for example, of 402.78 MHz band. The second down-converter 18 comprises amplifiers 20 and 24 for automatic gain control, a mixer 22, a variable oscillator 26, and prescaler 28 for dividing the frequency into $\frac{1}{2}$.

The PLL circuit 30, together with the variable oscillator 26 and the prescaler 28, constitutes a PLL. The microcomputer for channel selection 32 switches a frequency dividing ratio of a program divider contained in the PLL circuit 30 to switch a receiving channel, and performs an AFC operation for fine tuning. Meanwhile, a general PLL is well known, which is disclosed in, for example, Japanese Patent Laying-Open No. 60-77533.

The FM demodulating block 34 comprises a second IF filter 36, an amplifier 38, a PLL type FM demodulator 40, an AGC detector 42 for generating an AGC voltage, and a 1/256 frequency divider 44 made of ECL.

The counter circuit 46 directly counts an output signal of the 1/256 frequency divider 44. The period of resetting and counting operations of the counter circuit 46 is controlled by the microcomputer 32. Count data obtained by the counter circuit 46 is supplied to the microcomputer 32.

The output processing block 64 comprises a sound DPSK signal demodulator 48, a PCM decoder 50, a sound output circuit 52, an encoder 54 for a digital equipment output, a buffer amplifier 56, a low-pass filter/deemphasis circuit 58, a disversal circuit 60 for removing a triangular wave, and an output amplifier 62.

The PCM decoder 50 is, for example, TM4218N made by Toshiba corporation, which comprises a terminal $50a$ from which an NSYNC signal is outputted at the time of receiving a sound PCM signal in NTSC broadcasting. The sound output circuit 52 comprises a D/A converter for converting digital signals into analogue signals and a low-pass filter.

Furthermore, the BS tuner 16 comprises a group 66 of output terminals. The group 66 of output terminals comprises terminals $66a$, $66b$ for sound output, output terminals $66c$ and $66d$ of the DAT optical cable connecter specifications, an output terminal $66e$ for a bit stream, an output terminal $66f$ for a subscription broadcasting decoder, and a video signal output terminal $66g$.

The synchronizing separator circuit 68 extracts a vertical synchronizing signal $V_D$, to output the same to the microcomputer 32.

Description is made of an operation of the above described BS tuner 16.

In the BS tuner 16, the counter circuit 46 is operated in a predetermined time period, and the count data obtained by the counter circuit 46 is inputted to the microcomputer 32. The microcomputer 32 compares the count data with a predetermined reference data, thereby to detect the deviation in the frequency of the second IF signal. The microcomputer 32 changes the frequency dividing ratio of the program divider included in the PLL circuit 30 so as to correct the deviation.

The microcomputer 32 determines a predetermined period during which a counting operation is performed by the counter circuit 46 based on the vertical synchronizing signal $V_D$. This predetermined period is shown in FIG. 2.

In FIG. 2, (a) indicates an output of the PLL type FM demodulator 40, (b) indicates an output of the synchronizing separator circuit 68, (c) indicates a clear signal c1 outputted from the microcomputer for the counter circuit 46, and (d) indicates a gate signal "gate" outputted from the microcomputer 32 for designating the period during which the counting operation is performed by the counter circuit 46.

When the vertical synchronizing signal $V_D$ is inputted to the microcomputer 32 from the synchronizing separator circuit 68, the microcomputer 32 outputs the clear signal c1. At the same time, the microcomputer 32 outputs the gate signal "gate" in the vertical synchronization blanking period A (for 1024μ seconds), to allow the counting operation of the counter circuit 46. Thereafter, the microcomputer 32 ceases output of the gate signal "gate" in a period B and then, outputs the gate signal "gate" again in a period C of 1024μ seconds. The microcomputer 32 reads the count data obtained by the counter circuit 46 in a subsequent period D. In order to remove the effect of the triangular wave which is an energy diffusion signal, the microcomputer 32 compares a value obtained by adding four results of counting in a two frame period and dividing the results of the addition by 4 with the value of the reference data at the time of receiving NTSC broadcasting, to detect deviation in the frequency of the second IF signal. The microcomputer 32 adjusts the frequency dividing ratio of the PLL circuit 30 based on the deviation. In the above described manner, the AFC operation is performed.

In addition, the value of the period B in (d) in FIG. 2 is changed for each field to, for example, 6 m seconds, 4 m seconds, 6 m seconds and 8 m seconds, so that the value of the frequency in each portion on the screen is detected. Consequently, fluctuations caused by variation in brightness are prevented.

The microcomputer 32 controls the PLL circuit 30 for each two frame period to perform a mean value AFC operation. When the PLL circuit 30 is controlled for each field, the previous four results of counting may be averaged and the mean value may be compared with the values of the reference data, to perform the AFC operation.

Furthermore, although in the above described example, four results of counting in a four field (2 frames) period are averaged, it should be noted that the present invention is not limited to the same. For example, results of counting in a four-, six- or eight-frame period may be averaged.

As stated above, in each field, the reason why the counter circuit 46 is operated in the vertical blanking period A and any period B in the video signal period will be described in the following.

Essentially, a frequency level and a pedestal level of a vertical synchronizing signal in a vertical blanking period should be each constant all the time. Therefore, in order to perform an AFC operation, it is only necessary to detect the frequency level in the vertical blanking period A. However, if the counting operation is performed only in the vertical blanking period A, there is a possibility that a malfunction might be caused by a noise or the like. Therefore, the counter circuit 46 is also operated during any period B in the video signal period in addition to the vertical blanking period A.

A counting operation is also performed in the period B in order to cause the counting operation to correspond to the mean value AFC on the transmission side.

However, even though the methods described above were used, in fact, it was impossible to perform an AFC operation precisely. The cause thereof was not made clear, either.

A method has also been proposed in which a counting operation is performed within a period of one cycle of the energy diffusion signal (1/15 seconds). Such a method is disclosed, for example, in National Technical Report, Vol. 34, No. 5, Oct. 1988, pp. 54–61.

However, to implement this method, an additional frequency divider or a large-scale counter is needed.

SUMMARY OF THE INVENTION

An object of the present invention is to improve the accuracy of an AFC operation of an FM signal.

Another object of the present invention is to improve the accuracy of an AFC operation of a second intermediate frequency signal in an FM signal receiving apparatus.

Still another object of the present invention is to improve the accuracy of an AFC operation of a second intermediate frequency signal in a receiving apparatus capable of receiving an NTSC signal and a MUSE signal.

In order to attain the above described objects, the AFC method in accordance with the present invention comprises the steps of generating a first oscillation signal of a first frequency, converting an FM signal of a first intermediate frequency into an FM signal of a second intermediate frequency by mixing the FM signal of the first intermediate frequency with the first oscillation signal, defining a plurality of count periods in each video signal period including a horizontal blanking period, counting the FM signal of the second intermediate frequency either directly or indirectly in the plurality of defined count periods, and adjusting the frequency of the first oscillation signal based on the result of the counting. Preferably, the defining step shifts the plurality of count periods for each field.

The receiving apparatus in accordance with another aspect of the present invention comprises a first oscillator for generating a fist oscillation signal of a first frequency, and a first converter for converting an FM signal of a first intermediate frequency into an FM signal of a second intermediate frequency by mixing the FM signal of the first intermediate frequency with the first oscillation signal. This broadcasting receiving apparatus further comprises a count period defining circuit for defining a plurality of count periods in each video signal period including a horizontal blanking period, a counter for counting the FM signal of the second intermediate frequency either directly or indirectly in the plurality of count periods defined by the count period defining circuit, and an adjustment circuit for adjusting the frequency of the first oscillation signal to be generated from the first oscillator based on the counting result obtained by the counter.

From the result of an experiment, the inventors of the present application have confirmed that the NTSC signal is being transmitted in a way as shown in FIG. 3. As can be seen from FIG. 3, a luminance level corresponding to the center frequency of the carrier wave fluctuates in dependence on the level of the video signal transmitted. In the case of a video signal of 100% white-level the luminance level corresponding to the center frequency is indicated by L1. In the case of a video signal of 50% gray-level, the luminance level corresponding to the center frequency is indicated by L2. In the case of a video signal of the pedestal level, the luminance level corresponding to the center frequency is indicated by L3. These luminance levels L1, L2 and L3 are different from each other. It is believed that the reason for this is because the time constant of the mean value AFC used on the side of transmission is large, whereby AFC is functioning over the vertical synchronization period instead of the horizontal synchronization period.

Referring to FIG. 3, it can be seen that the luminance level of the tip portion of the vertical synchronization signal fluctuates in dependance on the level of the video signal, and the pedestal level also fluctuates in dependance on the level of the video signal. Thus, in practice, the frequency level of the NTSC signal transmitted in the vertical blanking period A is not constant. It thus has turned out that the frequency rather deviates if the counting operation of the frequency in the vertical blanking period A is conducted, and an AFC operation is performed using the counting result.

Accordingly, in the light of the fact that the proportion of the video signal period (Y) to the whole picture (77%) approximates to that of the video signal period (Y) to the period of the video signal period and the horizontal blanking period combined together (Y+H) (83%), as shown in FIG. 4, in the present invention, a plurality of count periods ar provided in this period (Y+H), and the count period is randomly set in this period (Y+H).

Preferably, in order to compensate for the local fluctuation of the frequency level of the video signal and the fluctuation of the frequency of the energy diffusion signal, at least the mean of a plurality of counting results in one cycle of the energy diffusion signal is compared to the reference data, and whereby the deviation of the frequency is detected. An AFC operation is thus performed with high accuracy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A-2D are is a waveform diagram of various signals in the satellite broadcasting receiving apparatus of FIG. 1;

FIGS. 5A-5D are waveform diagram of various signals for explaining an AFC method in accordance with one embodiment of the present invention;

FIGS. 8A-8E are waveform diagrams of various signals in the BS tuner of FIG. 6;

FIGS. 10A-10C are waveform diagrams of various signals in the BS tuner of FIG. 9;

FIG. 11 is a waveform diagram of various signals in the BS tuner of FIG. 9;

DESCRIPTION OF THE PREFERRED EMBODIMENTS

Referring to FIG. 5, an AFC method in accordance with one embodiment of the present invention will be explained.

The video signal period (Y+H) including the horizontal blanking period, but excluding the vertical blanking period D, is equally divided into two periods E. These periods E are each provided with the counting periods A1 and C1 therein. The periods B1 and B2 are randomly set for each field so that the counting periods A1 and C1 are each randomly shifted in the periods E for each field. In each field, the counter circuit is operated in the periods A1 and C1. In order to compensate for the effect of the energy diffusion signal ED, an AFC operation is performed based on the count data in 4 fields.

The BS tuner using the AFC method of FIG. 5 will now be described.

Figure 6:
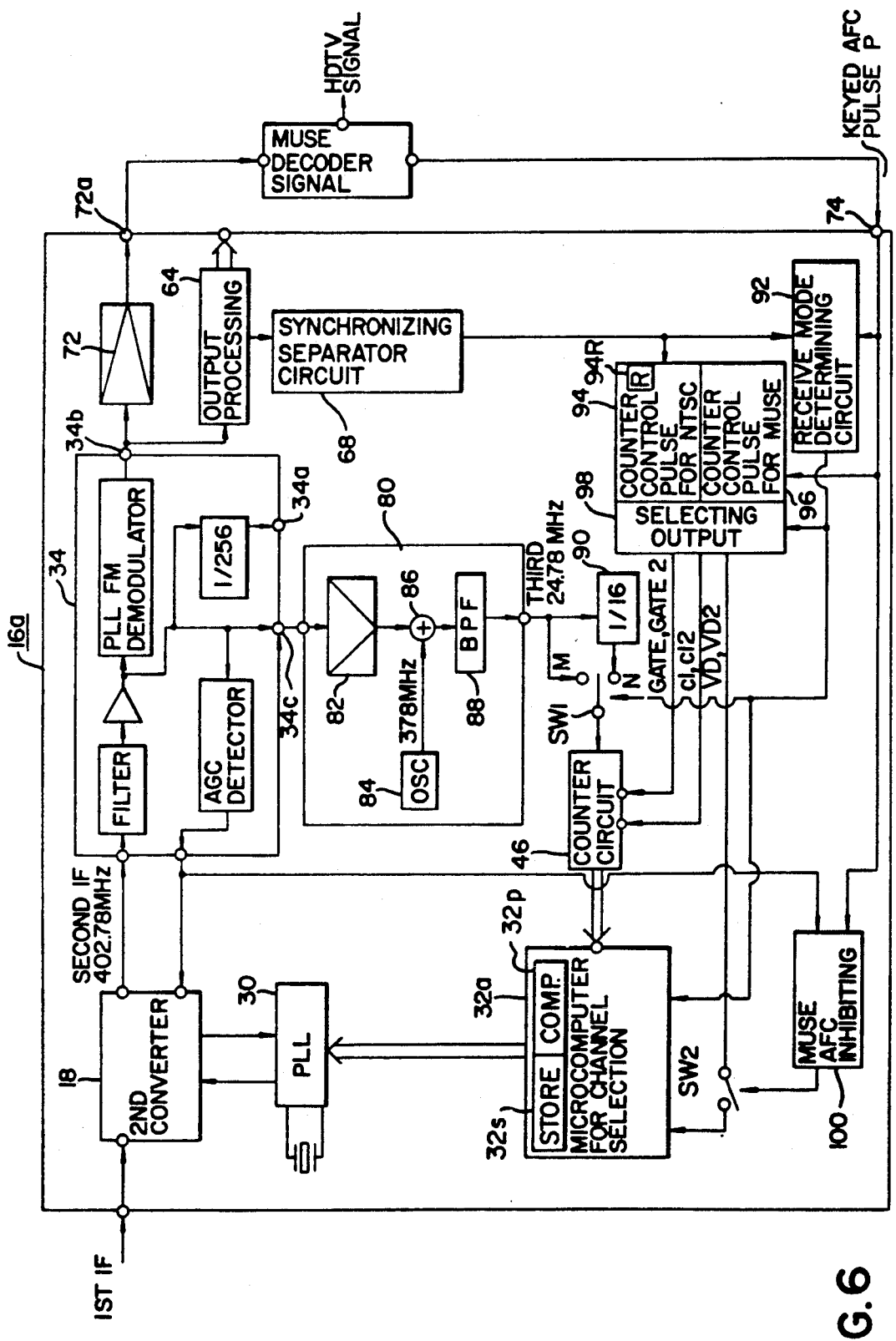
FIG. 6 is a block diagram showing a BS tuner configuration using the AFC method of the embodiment of the present invention.
Figure 9:
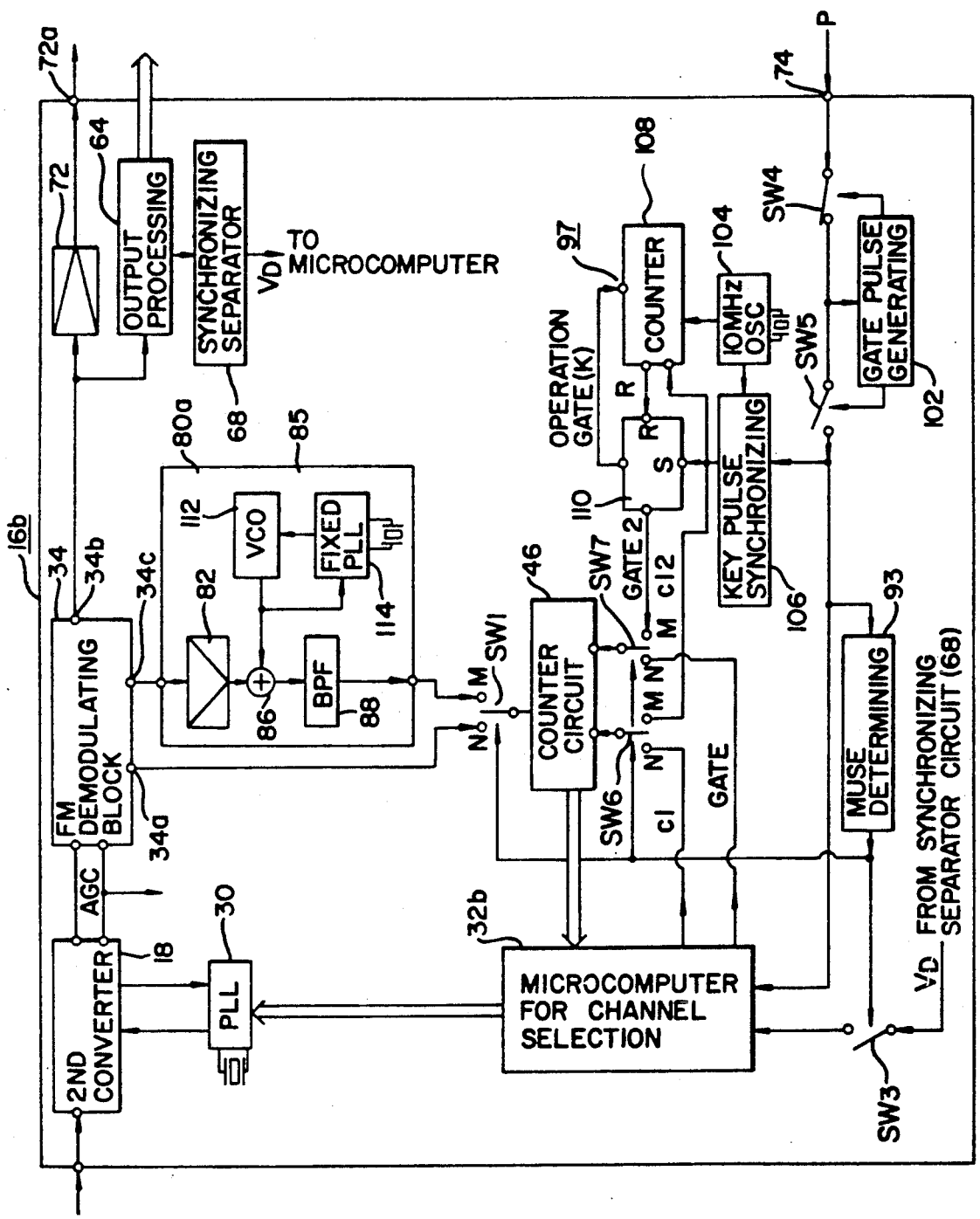
FIG. 9 is a block diagram showing a BS tuner configuration in accordance with a second embodiment of the present invention.
Figure 12:
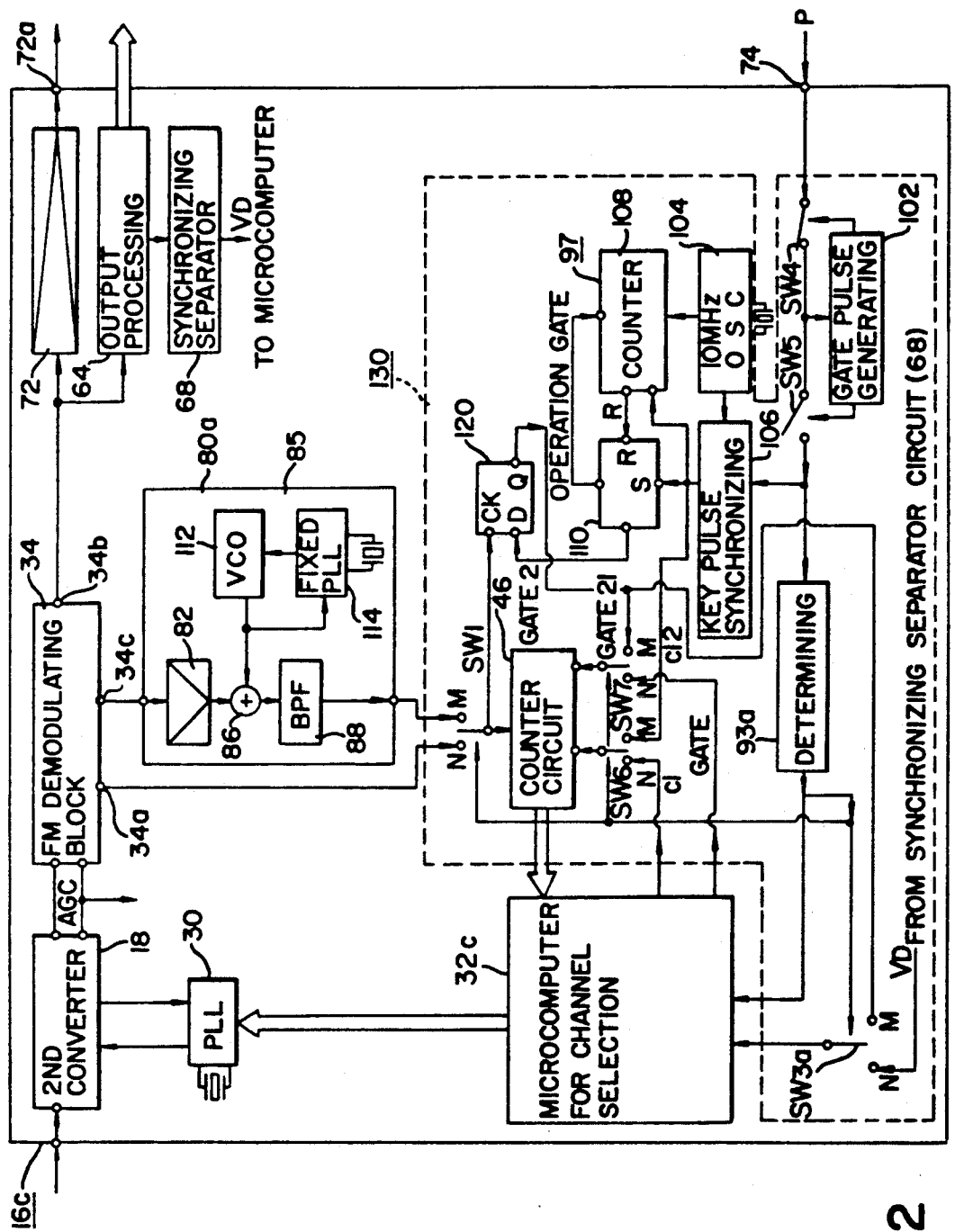
FIG. 12 is a block diagram showing a BS tuner configuration in accordance with a third embodiment of the present invention.

The BS tuners of FIGS. 6, 9 and 12 may be obtained by applying the AFC method of FIG. 5 to the BS tuners disclosed in the U.S. patent application Ser. No. 343,458, now U.S. Pat. No. 4,014,350, filed and assigned to the same assignee as that of the present invention.

Figure 1:
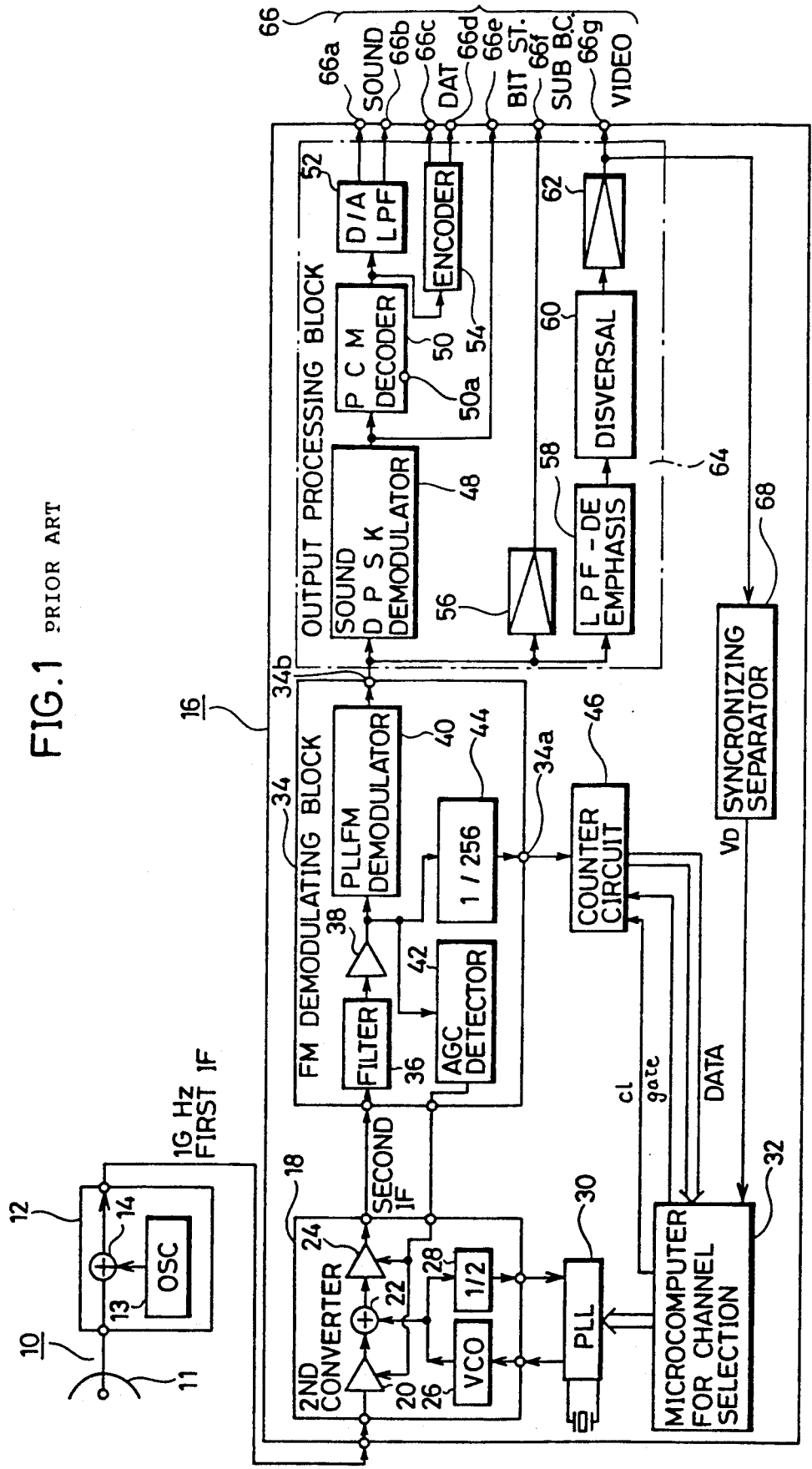
FIG. 1 is a block diagram showing one example of a conventional satellite broadcasting receiving apparatus.
Figure 3:
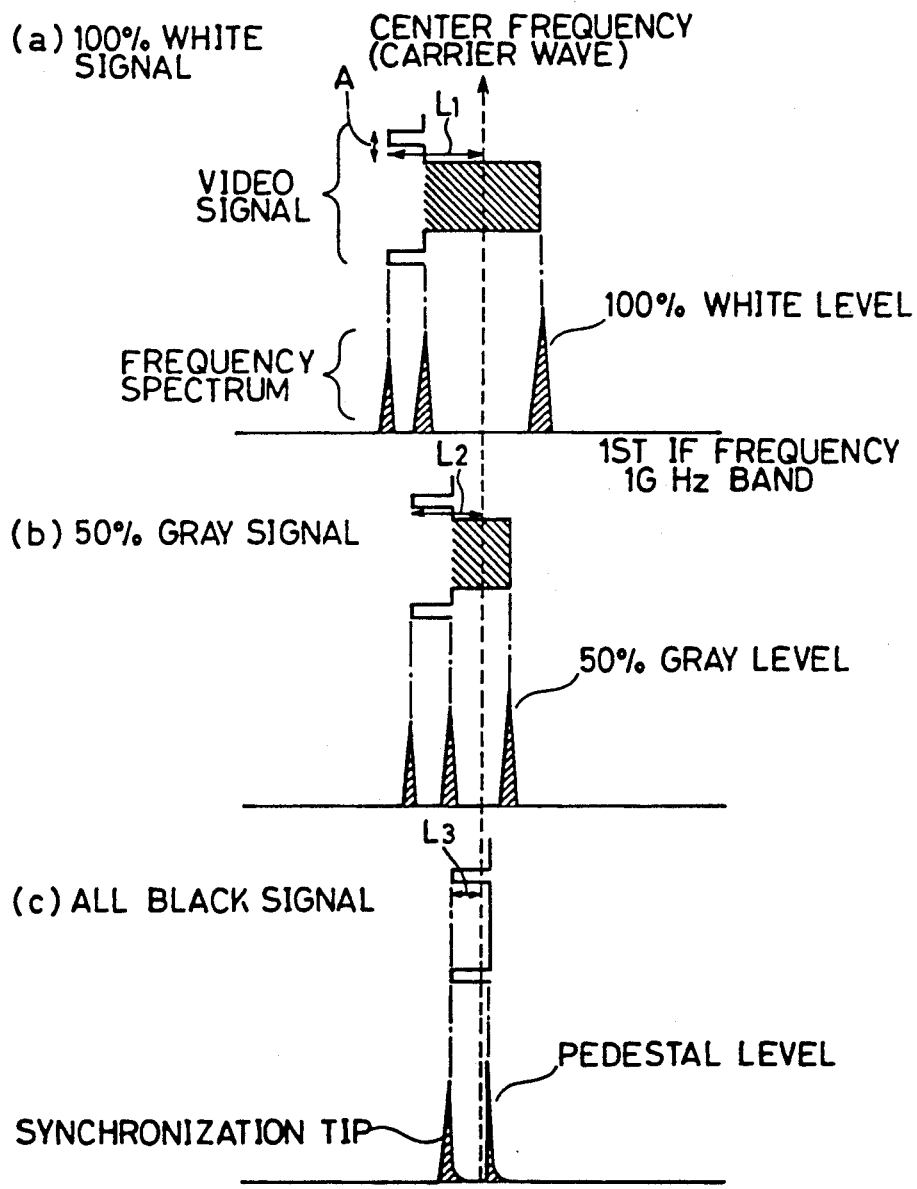
FIG. 3 is a diagram showing transmitted video signals of various levels.
Figure 4:
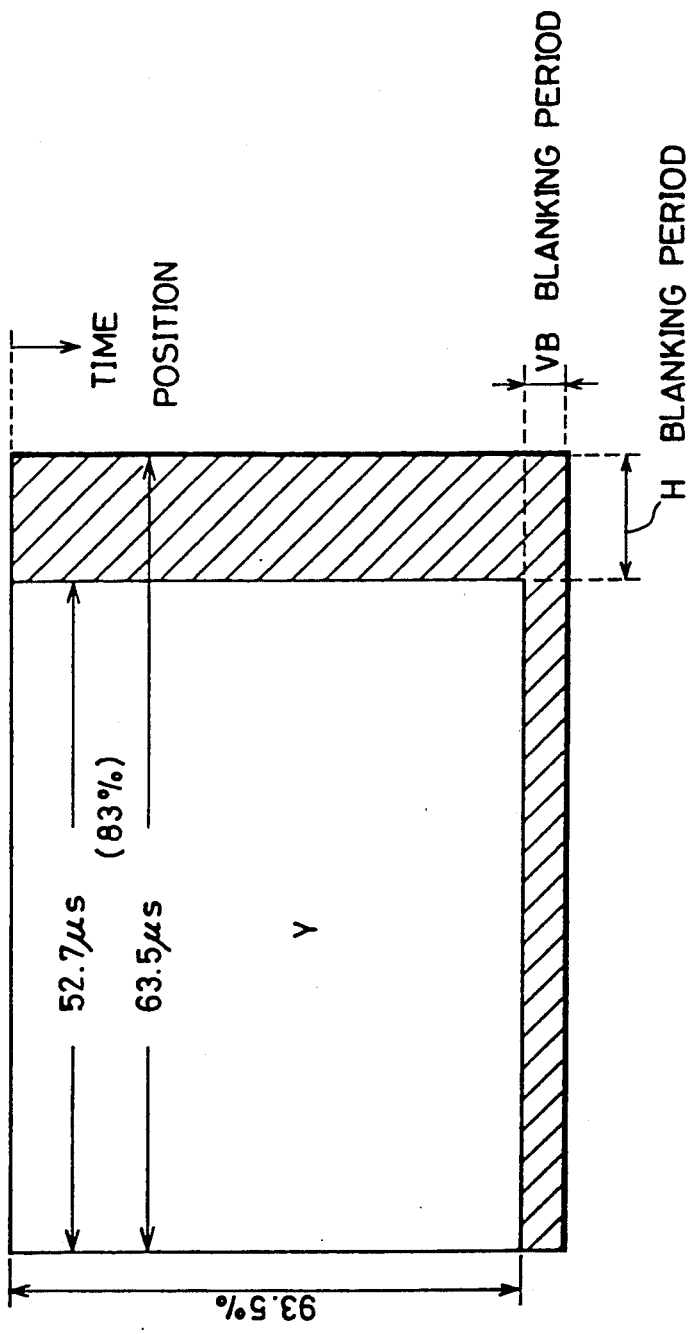
FIG. 4 is a diagram showing the video signal period, the horizontal blanking period and the vertical blanking period.

A BS tuner 16a shown in FIG. 6 comprises a second down-converter 18, a PLL circuit 30, a microcomputer 32a for channel selection, an FM demodulating block 34, a counter circuit 46, an output processing block 64, a synchronizing separator circuit 68, and a buffer 72 for a MUSE signal. The structures of the second down-converter 18 and the FM demodulating block 34 are the same as those shown in FIG. 1. However, the FM demodulating block 34 has a terminal 34c from which a second IF signal of 402.78 MHz is outputted.

The BS tuner 16a further comprises an AFC down-converter circuit 80. The AFC down-converter circuit 80 comprises an amplifier 82, a high stability oscillator 84 oscillating at the frequency of 378 MHz, a mixer 86, and a band-pass amplifier 88 allowing the passage of a signal of 24.7 MHz. The AFC down-converter circuit 80 mixes the second IF signal of 402.78 MHz applied from the FM demodulating block 34 with an oscillation signal of 378 MHz outputted from the oscillator 84. Consequently, a third IF signal of 24.7 MHz is obtained.

The BS tuner 16a further comprises a 1/16 frequency divider 90, a receive mode determining circuit 92, a counter control pulse generating circuit 94 for NTSC, a counter control pulse generating circuit 94 for MUSE, a selecting output circuit 98, an AFC inhibiting circuit 100, and switches SW1 and SW2.

The 1/16 frequency divider 90 frequency-divides frequency of the third IF signal into 1/16 of the frequency, to apply the same to a terminal N of the switch SW1. The third IF signal from the AFC down-converter circuit 80 is applied to a terminal M of the switch SW1.

The receive mode determining circuit 92 determines whether the NTSC broadcasting is being received, the MUSE broadcasting is being received, or it is other than that based on a synchronizing signal applied from the synchronizing separator circuit 68 and a keyed AFC pulse signal applied through a terminal 74 from the MUSE decoder 70, to apply the result of the determination to the microcomputer 32a as well as to switch the switch SW1. The switch SW1 is switched to the side of its terminal M at the time of receiving the MUSE broadcasting while being switched to the side of its terminal N at the time of receiving the NTSC broadcasting.

The counter control pulse generating circuit 94 for NTSC is responsive to the synchronizing signal applied from the synchronizing separator circuit 68 and provides a gate signal "gate", a clear signal c1 and a vertical synchronizing signal $V_D$ in such a way as shown in FIG. 5.

The counter control pulse generating circuit 96 for MUSE is responsive to a keyed AFC pulse signal P applied from the terminal 74 for generating a second gate signal "gate 2", a second clear signal c12 and a count data reading control signal $V_D2$. The selecting output circuit 98 selectively supplies the signals from the two pulse generating circuits 94 and 96 to the counter circuit 46 and the microcomputer 32a in accordance with the result of the determination of a receive mode applied from the receive mode determining circuit 92.

The AFC inhibiting circuit 100 opens the switch SW2 when the MUSE broadcasting is being received and an AGC voltage is low (at the time of a weak electric field). Consequently, input of the reading control signal $V_D2$ to the microcomputer 32a is cut off, so that the AFC operation is inhibited. The reason why the AFC operation is inhibited in such a case is that reliability of the AFC operation is decreased at the time of receiving a weak electric field. Meanwhile at the time of receiving the NTSC broadcasting, the sampling time is long. Thus, even if the second IF signal is slightly driven, no large malfunction of AFC occurs.

Referring now to waveform diagrams of FIGS. 5 and 8, description is made of an operation of the BS tuner 16a shown in FIG. 6.

The microcomputer 32a previously stores data representing a standard frequency dividing ratio corresponding to a plurality of channels of a broadcasting signal. When a user selects a channel to be received, the microcomputer 32a outputs to the PLL circuit 30 data representing a standard frequency dividing ratio corresponding to the channel. The broadcasting signal is received for a while based on the data representing the frequency dividing ratio.

Thereafter, when the receive mode determining circuit 92 determines that the receive mode is an NTSC receive mode based on the synchronizing signal applied from the synchronizing separator circuit 68, the selecting output circuit 98 supplies the clear signal c1 shown in (c) of FIG. 5 and the gate signal "gate" shown in (d) of FIG. 5 to the counter circuit 46, and supplies the vertical synchronizing signal $V_D$ to the microcomputer 32a. In addition, the receive mode determining circuit 92 informs the microcomputer 32a that the receive mode is an NTSC receive mode. Consequently, the microcomputer 32a starts an AFC operation for a NTSC broadcasting signal. At this time, the switch SW1 is connected to the side of its terminal N.

Figure 7A:
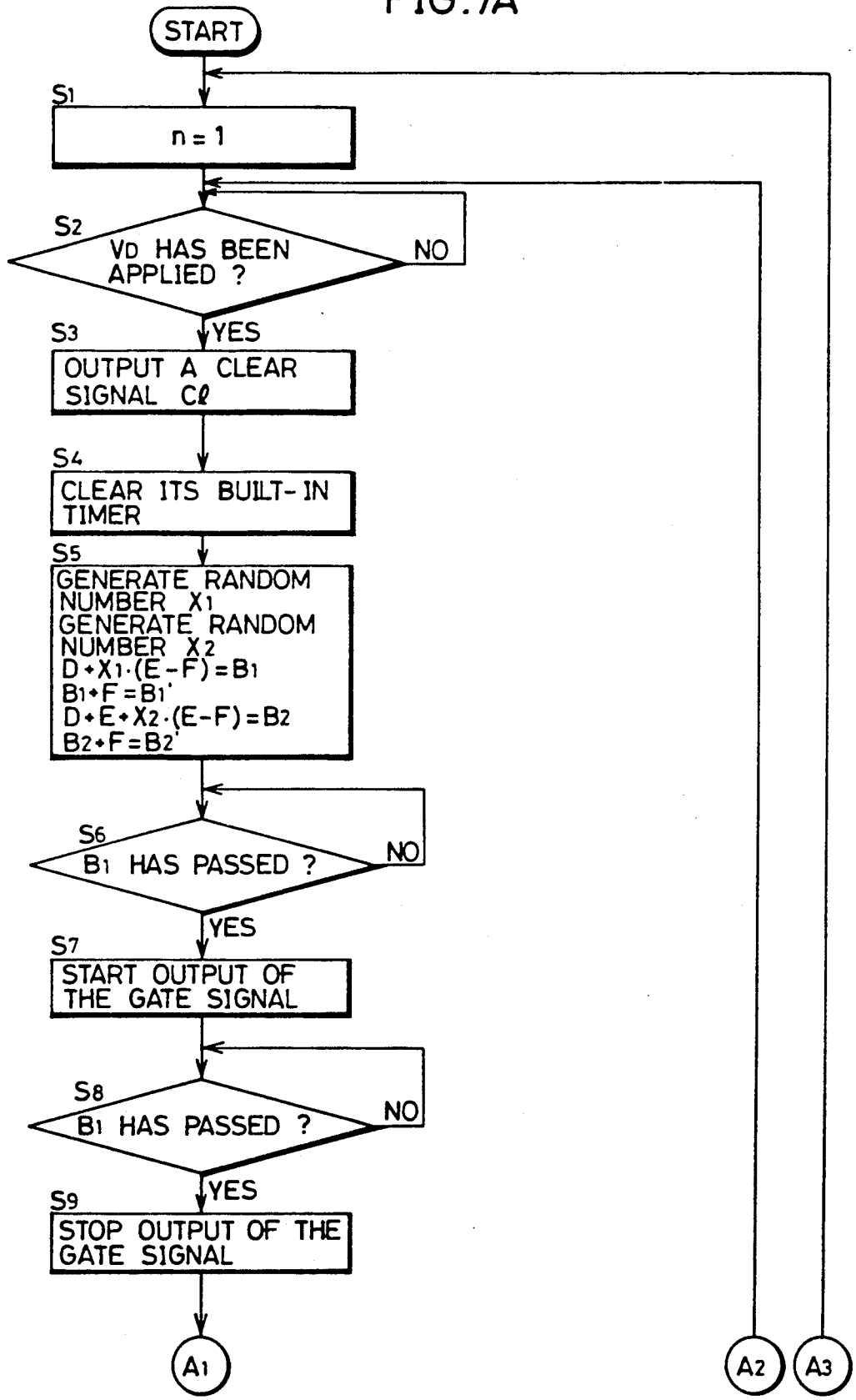
FIGS. 7A and 7B are flow charts showing the operation for implementing the AFC method of FIG. 5.
Figure 7B:
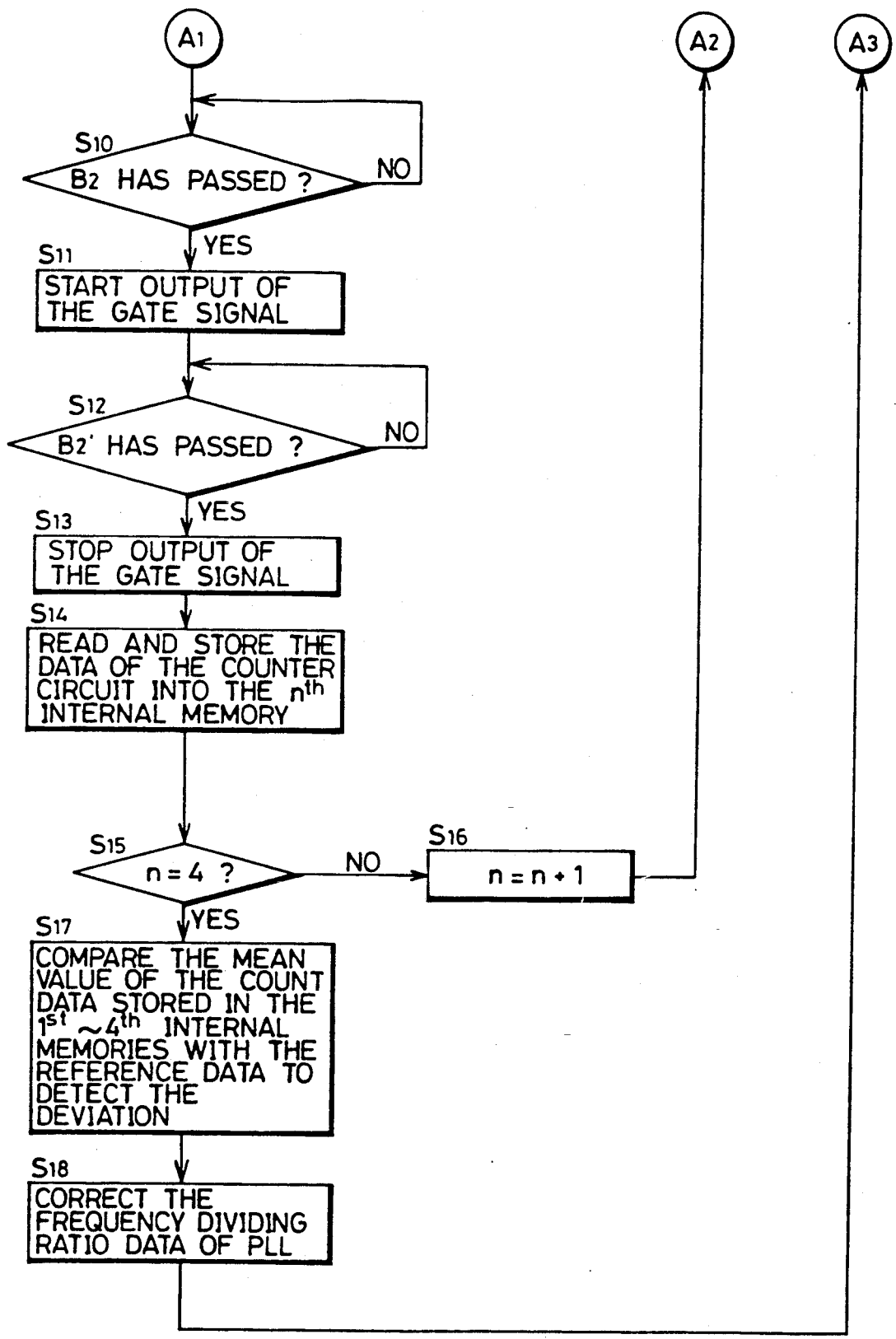

Referring to FIGS. 7A and 7B, the operation of the pulse generating circuit 94 will now be described.

This pulse generating circuit 94 may be hardware implemented, or may comprise a microcomputer and a program.

First, n=1 is set (step S1). Determination is made as to whether the vertical synchronizing signal $V_D$ has been applied from the synchronizing separator circuit 68 (step S2). When the vertical synchronizing signal $V_D$ is applied, the pulse generating circuit 94 applies a clear signal c1 (step S3). The pulse generating circuit 64 also clears its built-in timer (step S4) The pulse generating circuit 94 generates random numbers X1, X2, in a random number generator 94R and calculates the periods B1, B1', B2 and B2' in accordance with the following equation:

$$D+X1 \cdot (E-F)=B1$$

$$B1+F=B1'$$

$$D+E+X2 \cdot (E-F)=B2$$

$$B2+F=B2'$$

where, as shown in FIG. 5, D indicates the vertical blanking period, E indicates a half period of the video signal period, and F indicates each period of the counting periods A1, C1. X1 and X2 are each decimals less than 1. In the case of the NTSC signal, F=1.024 ms, D=1 ms and E=7.5 ms.

Subsequently, a determination is made, by way of the built-in timer, as to whether the period B1 has passed since the input of the clear signal c1 (step S6). When the period B1 has passed, the pulse generating circuit 94 starts output of the gate signal gate (step S7). In addition, determination is made, by way of the built-in timer, as to whether the period B1' has passed since the output of the clear signal c1 (step S8). When the period B1' has passed, the pulse generating circuit 94 stops output of the gate signal "gate" (step S9).

Moreover, determination is made, by way of the built-in timer, as to whether the period B2 has passed since the input of the clear signal c1 (step S10). When the period B2 has passed, the pulse generating circuit 94 starts output of the gate signal gate (step S11). Determination is further made, by way of the built-in timer, as to whether the period B2' has passed since the output of the clear signal C1 (step S12). When the period B2' has passed, the pulse generating circuit 94 stops output of the gate signal "gate" (step S13).

Thereafter, the microcomputer 32a reads and stores the count data of the counter circuit 46 into the n−th internal memory (step S14). Determination is made as to whether n=4 (step S15). Unless n=4, n=n+1 is set (step S16), and the operation of the steps S2-S14 is repeated. If n=4, the microcomputer 32a calculates the mean value of the count data stored in the first the fourth internal memories, and then compares in a comparing means 32p the mean value with the reference data for receiving NTSC previously stored thereby in a data storage area 32S thereof. The microcomputer 32a detects the deviation of the frequency of the second IF signal based on the result of the comparison (step S17). In this way, an AFC operation is performed by adjusting the frequency dividing ratio of the PLL circuit 30 (step S18).

The operation of the steps S1-S18 is repeated.

At the time of receiving MUSE broadcasting, a signal supplied from a terminal 72a is applied to the MUSE decoder 70 after channel selection. When the MUSE decoder 70 determines that the signal applied from the terminal 72a is a MUSE signal, the MUSE decoder 70 applies a keyed AFC pulse signal P to a terminal 74 of the BS tuner 16a. The receive mode determining circuit 92 determines that the receive mode is a MUSE receive mode based on the keyed AFC pulse signal P. As a result, the switch SW1 is connected to the side of its terminal M, and the microcomputer 32a starts an AFC operation for a MUSE broadcasting signal.

The selecting output circuit 98 outputs the second gate signal gate 2, the second clear signal c12 and the control signal $V_D2$ generated in the counter control pulse generating circuit 96 for MUSE.

FIG. 8 is a waveform diagram of these signals. In FIG. 8, (a) indicates a triangular wave superimposed on the MUSE signal, (b) indicates a keyed AFC pulse signal P applied from the MUSE decoder 70, (b') indicates a signal obtained by enlarging the keyed AFC pulse signal P indicated by (b) in the direction of a time axis, (c) indicates the second clear signal c12, (d) indicates the second gate signal gate 2, and (e) indicates the control signal $V_D2$, respectively.

As can be seen from FIG. 8, an output period of the keyed AFC pulse signal, which is the period of a clamp level signal, corresponds to a potential right in the center of the triangular wave. Therefore, at the time of receiving MUSE broadcasting, a value of count data obtained by the counter circuit 46 is not fluctuated for each field due to the effect of the triangular wave. Thus, theoretically, the AFC operation can be performed based on one count data without the effect of the triangular wave. However, in practice, there occurs deviation between the triangular wave and the MUSE signal at the time of superposition, delay in detecting of the keyed AFC pulse signal, and the like. Therefore, two count data sampled during at least one cycle (one frame) must be averaged.

In the above described embodiment, the AFC operation is performed by comparing the mean value of four count data in a two-frame period with the value of reference data used at the time of receiving MUSE broadcasting, in order to increase the reliability. In addition, the microcomputer 32a eliminates a count data too greatly spaced apart from other count data among the four count data and averages the remaining count data, for safety reason. The count data too greatly spaced apart from the reference data may be eliminated and four other count data preceding the count data may be averaged.

FIG. 9 is a block diagram showing the BS tuner configuration in accordance with another embodiment of the present invention.

In the BS tuner 16b of FIG. 9, a clear signal c1 and a gate signal "gate" at the time of receiving NTSC broadcasting are generated are generated by way of the microcomputer 32b. The microcomputer 32b generates the clear signal c1 and the gate signal "gate" by way of the operation shown in FIGS. 7a and 7b, as shown in FIG. 5. In addition, at the time of receiving NTSC broadcasting, 1/256 frequency dividing signal of the second IF signal is applied to the counter circuit 46.

When the vertical synchronizing signal $V_D$ is applied from a synchronizing separator circuit 68, the microcomputer 32b determines that NTSC broadcasting signal is received, to perform an AFC operation for an NTSC broadcasting signal. When a keyed AFC pulse signal P is applied, the microcomputer 32b determines that a MUSE broadcasting signal is received, to perform an AFC operation for a MUSE broadcasting signal. When neither of the vertical synchronizing signal $V_D$ and the keyed AFC pulse signal P is applied, the microcomputer 32b stops the AFC operation. More specifically, a frequency dividing ratio of a PLL circuit 30 is not changed and hence, is held at the previous value.

The BS tuner 16b shown in FIG. 9 further comprises a circuit 93 for determining whether or not MUSE broadcasting signal is received, a counter control signal generating circuit 97 for MUSE, a gate pulse generating circuit 102, and switches SW3 through SW7.

The MUSE broadcasting signal reception determining circuit 93 opens the switch SW3 at the time of receiving MUSE broadcasting in order to prevent the vertical synchronizing signal $V_D$ from being erroneously inputted to the microcomputer 32b. The switches SW1, SW6 and SW7 are normally connected to the side of the terminals N. The determining circuit 93 switches the switches SW1, SW6 and SW7 to the side of their terminals M at the time of receiving MUSE broadcasting.

The switch SW4 is a normally closed switch, and the switch SW5 is a normally opened switch. The gate pulse generating circuit 102 outputs a gate pulse signal G1 delayed by approximately 1/60 seconds indicated by (c) in FIG. 10 every time the keyed AFC pulse signal P indicated by (b) in FIG. 10 is inputted. During the period $\overline{G}$ shown in (c) of FIG. 10, the normally closed switch SW4 is opened. In addition, during the period G shown in (c) of FIG. 10, the normally opened switch SW5 is closed. In the above described manner, the regular keyed AFC pulse signal P inputted at intervals of 60 Hz passes through the switches SW4 and SW5, so that noise pulses are eliminated.

The counter control signal generating circuit 97 for MUSE comprises an oscillator 104 having an oscillation frequency of 10 MHz, a key pulse synchronizing circuit 106, a counter 108 and a gate signal generating circuit 110.

The counter control signal generating circuit 97 generates a second clear signal c12 and a second gate signal "gate 2". When a period during which a counting operation is performed by the counter circuit 46 is not set with high accuracy, a malfunction of AFC is caused to occur. Therefore, according to the present embodiment, a period of the second gate signal "gate 2" is set by an output of the oscillator 104.

The oscillator 104 outputs a clock signal ck indicated by (b) in FIG. 11. The key pulse synchronizing circuit 106 outputs the second clear signal c12 indicated by (c) in FIG. 11 after the keyed AFC pulse signal P indicated by (a) in FIG. 11 is inputted. The counter 108 is cleared by the second clear signal c12. The gate signal generating circuit 110 is set in response to the second clear signal c12. Consequently, the gate signal generating circuit 110 raises the second gate signal gate 2 indicated by (d) in FIG. 11. At the same time, the gate signal generating circuit 110 outputs an operation gate signal K indicated by (e) in FIG. 11 for allowing an operation of the counter 108.

As a result, the counter 108 initiates counting of the clock signal ck. When the counter 108 counts 160 clock signals ck, it outputs a reset signal R indicated by (f) in FIG. 11. The gate signal generating circuit 110 is responsive to the reset signal R for lowering the second gate signal "gate 2". In addition, the gate signal generating circuit 110 brings the operation gate signal K into a low level, to inhibit an operation of the counter 108.

An AFC down-converter circuit 80a comprises a high stability oscillator 85 for generating a third IF signal, instead of the oscillator 84 shown in FIG. 6. The high stability oscillator 85 comprises an oscillator 112 having an oscillation frequency of 378 MHz and a PLL circuit 114. The PLL circuit 114 comprises a crystal (precision $10^{-5}$) having a frequency of 4 MHz, and contains an ECL prescaler. The frequency dividing ratio of the PLL circuit 114 is fixed. As described in the foregoing, according to the present embodiment, the oscillator 112 is controlled by forming a PLL. Consequently, fluctuations in the oscillation frequency is suppressed within ±37.8 KHz.

Meanwhile, even in the BS tuner 16b shown in FIG. 9, the same measures may be taken as those taken when MUSE broadcasting in a weak electric field is received. For example, as in the BS tuner 16a shown in FIG. 6, by way of the AGC signal, reception of broadcasting in a weak electric field is detected so that an AFC operation may be stopped. In addition, as a broadcasting signal attains a weak electric field, a period for averaging may be set longer. For example, at the time of the weak electric field, the period for averaging may be set to an eight frame period.

The level of an AGC voltage may be displayed in order to inform a user of the presence or absence of broadcasting. In order to inform a user that the receive mode of the BS tuner is a MUSE broadcasting receive mode, a lamp may be lighted up in the period during which the keyed AFC pulse signal is inputted. In order to inform the user that the receive mode of the BS tuner is a NTSC broadcasting receive mode, an output of the terminal 50a of the PCM decoder 50 shown in FIG. 1 may be utilized.

The MUSE decoder 70 shown in FIG. 6 may be contained in the BS tuner. Although in the embodiment shown in FIGS. 6 and 9, a single counter circuit 46 is provided, a counter circuit for MUSE and a counter circuit for NTSC may be separately provided. A TV tuner (tuner for ground broadcasting) for receiving a UHF signal, a VHF signal and a CATV signal may be contained in the BS tuner. In this case, oscillation frequencies of the oscillators 84 and 112 need to be set to a frequency between channels so as not to be overlapped with a channel transmission band of the above described television signal.

FIG. 12 is a block diagram showing a structure of a BS tuner according to a third embodiment of the present invention.

In FIG. 12, the same portions as those shown in FIG. 9 have the same reference numerals and hence, the description thereof is not repeated. In the present embodiment, a circuit for implementing the present invention is made an integrated circuit.

In FIG. 12, a gate array IC130 comprises a counter circuit 46, a circuit 93a for determining whether MUSE broadcasting is received, a counter control signal generating circuit 97, a gate pulse generating circuit 102, a D flip-flop 120 and switches SW1, SW3a, SW4 through SW7.

When a broadcasting signal received is dropped for a short term and a down-converter 80a fails, a malfunction of AFC occurs. As a safety measure, the gate array 130 detects the presence or absence of a third IF signal, to stop an AFC operation when the third IF signal does not exist. In this case, the frequency of a second IF signal is held at a previous value.

The determining circuit 93a informs a microcomputer 32c for channel selection that MUSE broadcasting is being received. In addition, this determining circuit 93a generally switches the switch SW3a connected to the side of its terminal N to the side of its terminal M at the time of receiving MUSE broadcasting. Consequently, a keyed AFC pulse signal (pseudo second gate signal) gate 21 shaped in the counter control signal generating circuit 97 is applied to the microcomputer 32c.

The microcomputer 32c determines whether the receive mode is an NTSC receive mode or a MUSE receive mode based on a signal from the determining circuit 93a, to execute a program corresponding to the mode. The microcomputer 32c accepts count data from the counter circuit 46 at timing set in response to the fall of a vertical synchronizing signal from the switch SW3a or the pseudo second gate signal gate 21.

The third IF signal is supplied to a clock terminal CK of the D flip-flop 120 which characterizes the present embodiment from the down-converter 80 through the switch SW1. The D flip-flop 120 outputs the pseudo second gate signal gate 21 obtained by delaying the second gate signal gate 2 shown in FIG. 9 in a cycle of the third IF signal. If the supply of the third IF signal is stopped, the D flip-flop 120 holds a value (generally 0) taken before the supply of the third IF signal is stopped. Therefore, the pseudo second gate signal gate 21 is not applied to the microcomputer 32c. Thus, the microcomputer 32c does not accept count data, to substantially stop the AFC operation.

In the BS tuner 16c shown in FIG. 12, the second gate signal gate 2 generated in the same manner as that in the BS tuner 16b shown in FIG. 9 is applied to a terminal D of the D flip-flop 120. When the supply of the third IF signal to the clock terminal CK of the D flip-flop 120 is stopped, the pseudo second gate signal gate 21 is not outputted from an output terminal Q of the D flip-flop 120. The count data is read at timing of the fall of the pseudo second gate signal gate 21. Therefore, if the pseudo second gate signal gate 21 is not outputted, the microcomputer 32c stops reading of the count data. Thus, the value of the oscillation frequency of the PLL circuit 30 is held which is caused by the AFC operation, at the time point when the supply of the third IF signal is stopped.

As described in the foregoing, according to the embodiment shown in FIG. 12, when the supply of the third IF signal is stopped, the supply of the pseudo second gate signal gate 21 to the microcomputer 32c is stopped. Consequently, the AFC operation is stopped.

In the above described embodiment, the D flip-flop 120 is provided between the gate signal generating circuit 110 and the switch SW7. However, the D flip-flop 120 may be provided between the switches SW7 and SW3a.

According to the embodiment shown in FIG. 12, a malfunction to occur when the third IF signal is dropped is prevented by a single D flip-flop 120. However, a detecting circuit for detecting a state in which the third IF signal is dropped and a stopping circuit for stopping the AFC operation of the microcomputer 32a in response to an output of the detecting circuit at the time of receiving MUSE broadcasting may be separately provided. In this case, the reliability is improved. Means for stopping the AFC operation when the supply of the third IF signal is stopped can also be applied to the BS tuner 16a shown in FIG. 6. In addition, the AFC operation of a NTSC broadcasting signal may be stopped (held at the previous value) at the time of receiving NTSC broadcasting.

Figure 13:
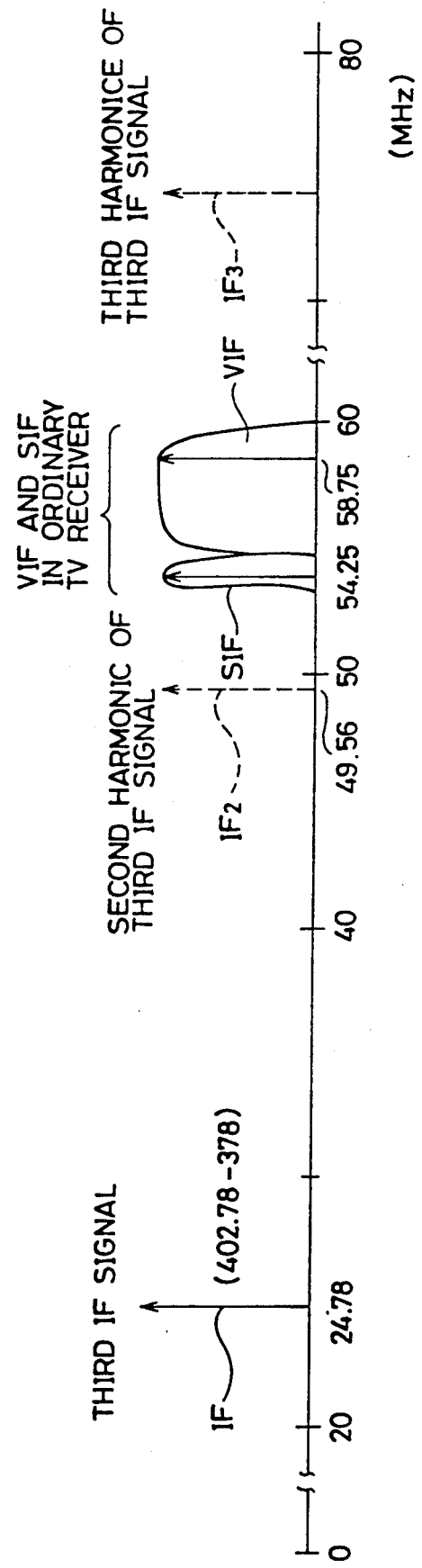
FIG. 13 is a diagram for explaining one example of the frequency of a third intermediate frequency signal.

In the above described first to third embodiments, the frequency of the third IF signal applied from the AFC down-converter circuit 80 or 80a is set as shown in, for example, FIG. 13 so as not to adversely affect ordinary VHF, UHF and CATV tuners contained in this tuner or arranged in close proximity.

In Japanese television broadcasting, the frequency of a sound intermediate frequency signal SIF is set to 54.25 MHz, and the frequency of a video intermediate frequency signal VIF is set to 58.75MHz. When the frequency of the third IF signal outputted from the AFC down-converter circuit 80 or 80a in the BS tuner is set to 24.78 MHz, the frequency of a second harmonic IF2 of the third IF signal becomes 49.56 MHz. Thus, the frequency of the third IF signal is set such that the frequency of the second harmonic of the third IF signal is not overlapped with the frequencies of the sound intermediate frequency signal and the video intermediate frequency signal. In addition, the frequency of the third IF signal is set such that the frequency of a third harmonic IF3 of the third IF signal is not overlapped with the frequencies of the sound intermediate frequency signal SIF and the video intermediate frequency signal VIF.

Figure 14:
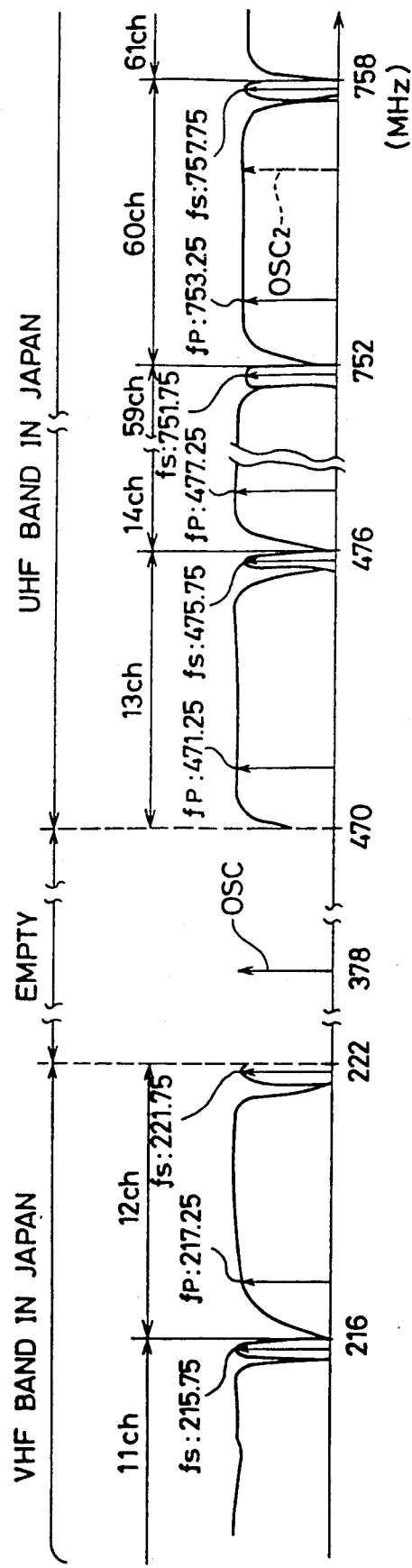
FIG. 14 is a diagram for explaining one example of the oscillation frequency of the oscillation circuit.
Figure 15:
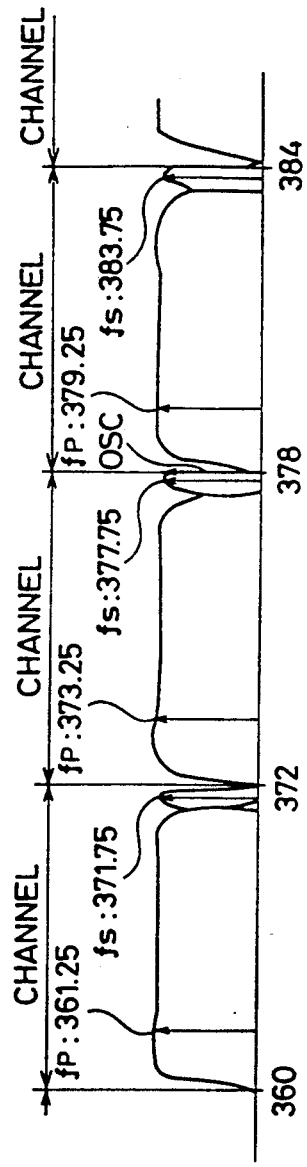
FIG. 15 is a diagram for explaining another example of the oscillation frequency of the oscillation circuit.

Additionally, the oscillation frequencies of the oscillators 84 and 112 included in the AFC down-converters 80 and 80a are set as shown in FIG. 14. As shown in FIG. 14, in Japanese television broadcasting, an empty region exists between the VHF band and the UHF band. Thus, the frequency of an oscillation signal OSC outputted from the oscillators 84 and 112 is set between 222 MHz and 470 MHz. In this case, the frequency of the oscillation signal OSC is set such that a second harmonic component OSC2 of the oscillation signal OSC is not overlapped with the frequencies of a video carrier $f_P$ and a sound carrier $f_S$ in any one channel. For example, when the frequency of the oscillation signal OSC is set to 378 MHz, the frequency of the second harmonic component OSC2 becomes an exactly intermediate frequency between the frequencies of the video carrier $f_P$ and the sound carrier $f_S$ in the 60th channel.

If channels are assigned to the empty region between the VHF band and the UHF band as shown in FIG. 5, the frequencies of the oscillation signals outputted from the oscillators 84 and 112 are set so as not to be overlapped with the frequencies of the video carrier $f_P$ and the sound carrier $f_S$ in their channels. In FIG. 13, the frequency of the oscillation signal is set to 378 MHz between the frequency 377.75 MHz of the sound carrier $f_s$ and the frequency 379.25 MHz of the video carrier $f_P$. In addition, this frequency 378MHz is a frequency in the boundary exactly between the channels.

In the above described embodiment, while four counting results during a period of 4 fields (2 frames) are averaged, the present invention is not limited to the same. The counting results during 4, 6 or 8 frame periods or the like may be averaged as well.

In addition, while the count periods A1, C1 are dynamically set based on the random numbers in the above described embodiment, they may be set previously in a fixed manner so that the positions of the count periods A1, C1 will be at random in the video signal period (Y+H) for each field.

As stated above, in accordance with the above described embodiment, at the time of receiving NTSC broadcasting, a plurality of count periods A1, C1 are provided in the video signal period (Y+H) excluding the vertical blanking period D, and the count periods A1, C1 may be randomly set for each field. Therefore, the frequency fluctuation of the second IF signal may be detected accurately, and an AFC with high accuracy is made possible. In addition, at the time of receiving MUSE broadcasting, the second IF signal is converted to the third IF signal in accordance with the frequency mixing mode. Therefore the portion of the second IF signal which fluctuates is not frequency-divided. Accordingly, the frequency fluctuation of the second IF signal may be detected accurately, and an AFC operation with high accuracy is made possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic frequency controlling method of an FM signal, comprising the steps of:

generating a first oscillation signal of a first frequency;

converting an FM signal of a first intermediate frequency into an FM signal of a second intermediate frequency by mixing the FM signal of the first intermediate frequency with said first oscillation signal wherein said FM signal of said second intermediate frequency comprises a plurality of field periods;

defining a plurality of count periods within each of a plurality of video signal periods, said video signal periods being defined within said field periods and including therein a horizontal blanking period;

counting the FM signal of said second intermediate frequency in the plurality of defined count periods; and adjusting the frequency of said first oscillation signal based on a result of said counting step.

2. An AFC method according to claim 1, wherein said defining step includes shifting randomly said plurality of count periods for each field.

3. An AFC method according to claim 2, wherein said adjusting step includes adjusting the frequency of said first oscillation signal based on the counting results in the plurality of field periods.

4. An AFC method according to claim 3 further comprises the step of:

calculating the mean value of the counting results in the plurality of field periods, said adjusting step including adjusting the frequency of said first oscillation signal based on said mean value.

5. An AFC method according to claim 4, wherein said FM signal comprises an energy diffusion signal, and said plurality of field periods correspond to at least one cycle of said energy diffusion signal.

6. An AFC method according to claim 1, wherein at least one of the plurality of count periods defined in each video signal period is defined within a half period before each video signal period, and at least one of the others of said plurality of count periods is defined within a half period after said video signal period.

7. A receiving apparatus for demodulating an FM signal the frequency of which is converted into a first intermediate frequency, comprising:
first oscillation (26) for generating a first oscillation signal of a first frequency;
first converting means (18) for converting said FM signal of said first intermediate frequency into an FM signal of a second intermediate frequency by mixing said FM signal of said first intermediate frequency into said first oscillation signal wherein said FM signal of said second intermediate frequency comprises a plurality of field periods;
counter defining means (95, 32b, 32c) for defining a plurality of count periods within each of a plurality of video signal periods, said video signal periods being defined within said field periods and including therein a horizontal blanking period;
counter means (46) for counting the FM signal of said second intermediate frequency in the plurality of count periods defined by said counter defining means; and
adjusting means (30, 32a, 32b, 32c) for adjusting the frequency of said first oscillation signal to be generated from said first oscillation means (26) based on a counting result of said counter means.

8. A receiving apparatus according to clam 7, wherein
said counter defining means (94, 32b, 32c) shift randomly said plurality of count periods for each field.

9. A receiving apparatus according to claim 8, wherein
said adjusting means (30, 32a, 32b, 32c) adjust the frequency of said first oscillation signal based on the counting results in the plurality of field periods.

10. A receiving apparatus according to claim 8 further comprises mean value calculating means (32a, 32b, 32c) for calculating a mean value of the counting results in the plurality of field periods.

11. A receiving apparatus according to claim 10, wherein
said FM signal comprises an energy diffusion signal, and
said plurality of field periods correspond to at least one cycle of said energy diffusion signal.

12. A receiving apparatus according to claim 7 further comprises synchronizing signal detection means (68) for detecting a vertical synchronizing signal,
said counter defining means (94, 32b, 32c) defining said plurality of count periods in response to said vertical synchronizing signal.

13. A receiving apparatus according to claim 12, wherein
said counter defining means (94, 32b, 32c) generate a clear signal in response to said vertical synchronizing signal, and then generate a gate signal at a plurality of random times within said video signal period, and
said counter means (46) is responsive to said clear signal to be reset, and continues the counting operation while said gate signal is being supplied.

14. A receiving apparatus according to claim 7, wherein
said counter defining means (94, 32b, 32c) further comprises a means for generating a random number, and defines said plurality of count periods based on said random number.

15. A receiving apparatus according to claim 7, wherein
said adjusting means (30, 32a, 32b, 32c) comprises storage means for storing predetermined reference data and comparing means for comparing said counting result with said reference data.

16. A receiving apparatus for receiving a first FM signal having a first period of a cyclic and constant level and a second FM signal having a second period of a cyclic and constant level, said first period being longer than said second period, wherein a frequency of said first and second FM signals is converted into a first intermediate frequency,
said apparatus comprising:
first oscillation means (26) for generating a first oscillation signal of a first frequency;
first converting means (18) for converting said FM signal of said first intermediate frequency into an FM signal of a second intermediate frequency by mixing said FM signal of said first intermediate frequency with said first oscillation signal wherein said FM signal of said second intermediate frequency comprises a plurality of field periods;
second converting means (80, 80a) for converting said FM signal of said second intermediate frequency into a signal of a third frequency lower than said second intermediate frequency in accordance with a predetermined frequency mixing mode;
first counter defining means (94, 32b, 32c) for defining a plurality of count periods within each of a plurality of video signal periods, said video signal periods being defined within said field periods and including therein a horizontal blanking period at the time of receiving said first FM signal;
second counter (46) for counting the FM signal of said second intermediate frequency in a plurality of count periods defined by said first counter defining means, at the time of receiving said first FM signal, and for counting the signal of said third intermediate frequency in a count period defined by said second count defining means, at the time of receiving said second FM signal; and
adjusting means (30, 32a, 32b, 32c) for adjusting the frequency of the first oscillation signal to be generated from said first oscillation means (26) based on a counting result of said counter means (46).

17. A receiving apparatus according to claim 16, wherein
said counter means (46) counts signals obtained by frequency-dividing the signal of said third intermediate frequency at the time of receiving said first FM signal, and counts the signal of said third intermediate frequency at the time of receiving said second FM signal.

18. A receiving apparatus according to claim 16, wherein
said counter means (46) counts said FM signal of said second intermediate frequency from said first converting means (18) at the time of receiving said first FM signal, and counts the signals of said third intermediate frequency from said second converting means (80a) at the time of receiving said second FM signal.

19. A receiving apparatus according to claim 16, wherein
said first FM signal is a FM signal of NTSC, and said second FM signal is a FM signal of MUSE.

* * * * *